(12) United States Patent  
LaCour (10) Patent No.: US 6,703,167 B2  
(45) Date of Patent: Mar. 9, 2004

(54) PRIORITIZING THE APPLICATION OF RESOLUTION ENHANCEMENT TECHNIQUES

(76) Inventor: Patrick Joseph LaCour, 2112 Fleming Dr., McKinney, TX (US) 75070

( * ) Notice: Subject to any disclaimer, the term of this patent is extended or adjusted under 35 U.S.C. 154(b) by 39 days.

(21) Appl. No.: 09/837,889

(22) Filed: Apr. 18, 2001

(65) Prior Publication Data

US 2002/0155357 A1 Oct. 24, 2002

(51) Int. Cl.$^7$ ................................................ G03F 9/00
(52) U.S. Cl. ......................................................... 430/5
(58) Field of Search ........................... 430/5, 296, 322; 716/19, 20, 21

(56) References Cited

U.S. PATENT DOCUMENTS

| | | | |
|---|---|---|---|
| 5,663,893 A | 9/1997 | Wampler et al. | 364/491 |
| 5,682,323 A | 10/1997 | Pasch et al. | 364/491 |
| 5,705,301 A | 1/1998 | Garza et al. | 430/5 |
| 5,707,765 A | 1/1998 | Chen | 430/5 |
| 5,821,014 A | 10/1998 | Chen et al. | 430/5 |
| 6,139,994 A | 10/2000 | Broeke et al. | 430/5 |
| 6,175,953 B1 | 1/2001 | Scepanovic et al. | 716/21 |
| 6,210,841 B1 | 4/2001 | Lin et al. | 430/5 |
| 6,413,683 B1 * | 7/2002 | Liebmann et al. | 430/5 |
| 6,453,457 B1 * | 9/2002 | Pierrat et al. | 716/19 |

OTHER PUBLICATIONS

Schellenberg, Frank M., "Sub–Wavelength Lithography Using OPC," *Semiconductor Fabtech*, 9$^{th}$ Edition, Mar. 1999, pp. 205–209.

Mansfield, Scott M., et al., "Lithographic Comparison of Assist Feature Design Strategies," distributed at an oral presentation at SPIE Microlithogrpahy Conference around Feb., 2000.

Liebmann, Lars W., et al., "Optimizing Style Options for Sub–Resolution Assist Features," distributed at an oral presentation at SPIE Microlithography Conference around Feb., 2001.

* cited by examiner

Primary Examiner—S. Rosasco  
(74) Attorney, Agent, or Firm—Michael O. Scheinberg (57) ABSTRACT

The present invention comprises a method and apparatus for prioritizing the implementation of resolution-enhancing mask corrections such as scattering bars on lithography tools. Prioritizing conflicting resolution-enhancing mask corrections produces a lithography tool having improved fidelity because corrections that provide the most beneficial effects can be implemented at the expense of corrections that provide less benefit. In a preferred embodiment, the prioritization is based on the geometry of the conflicting correction. For example, assist features that are closer to their respective generating edge may be assigned higher priorities, and assist features generated from orthogonal edges may be assigned higher priorities than features generated from angled edges.

25 Claims, 9 Drawing Sheets

PRIORITIZING THE APPLICATION OF RESOLUTION ENHANCEMENT TECHNIQUES

TECHNICAL FIELD OF THE INVENTION

The invention relates to lithography, and in particular, to optical and process correction techniques for lithography tools.

BACKGROUND OF THE INVENTION

The fabrication of integrated circuits on a semiconductor substrate typically includes multiple photolithography steps. A photolithography process typically begins by applying a thin layer of a photoresist material to the substrate surface. The photoresist is then exposed through a photolithography tool to a radiation source that changes the solubility of the photoresist at areas exposed to the radiation. The photolithography tool typically includes transparent regions that do not interact with the exposing radiation and a patterned material or materials that interact with the exposing radiation, either to block it or to shift its phase.

Areas of the photoresist that are not exposed to the radiation do not change in solubility, so those unexposed areas (if "negative photoresist" is used), or the exposed areas (if "positive photoresist" is used) can be washed away by a developer, leaving patterned photoresist on the substrate. The patterned photoresist is then used as a protective layer during a subsequent fabrication step, such as etching an underlying layer or diffusing atoms into unmasked areas of the substrate.

"Masks" and "reticles" are types of lithography exposure tools, that is, tools that alter radiation to print an image. The term "mask" is sometimes reserved for photolithography exposure tools that print an entire wafer in one exposure, and the term "reticle" is sometimes reserved for a photolithography exposure tool that projects a demagnified image and prints less than the entire wafer during each exposure. The term "mask" is more commonly used generically, however, to refer to any type of lithography exposure tool. The term "mask" is used herein in its broadest sense to mean any type of lithography exposure tool, regard less of the magnification, the type of exposing radiation, the fraction of the wafer that is printed in each exposure, or the method, such as reflection, refraction, or absorption, used to alter the incoming radiation.

A photolithography mask typically comprises a quartz substrate with a patterned layer of opaque chromium that corresponds to the circuit pattern to be transferred to the substrate. A mask can also include a material, such as silicon nitride, that shifts the phase of the exposing radiation. A reduced image of the mask is typically projected onto the substrate, the image being stepped across the substrate in overlapping steps to repeat the pattern.

As each successive generation of integrated circuits crowd more circuit elements onto the semiconductor substrate, it is necessary to reduce the size of the features, that is, the lines and spaces that make up the circuit elements. The minimum feature size that can be accurately produced on a substrate is limited by the ability of the fabrication process to form an undistorted optical image of the mask pattern onto the substrate, the chemical and physical interaction of the photoresist with the developer, and the uniformity of the subsequent process, e.g., etching or diffusion, that uses the patterned photoresist.

When a photolithography system attempts to print circuit elements having sizes near the wavelength of the exposing radiation, the printed circuit elements becomes significantly different from the pattern on the mask. For example, linewidths vary depending on the proximity of other lines. The inconsistent line widths can then cause circuit components that should be identical to operate at different speeds, thereby creating problems with the overall operation of the integrated circuit. As another example, lines tend to shorten, that is, the line ends "pull back." The small amount of shortening becomes more significant as the lines themselves are made smaller. Pulling back of the line ends can cause connections to be missed or to be weakened and prone to failure.

Because of the wave nature of light, even a perfectly straight, opaque edge will not produce a shadow that is absolutely dark in the shadowed areas. A phenomenon known as diffraction causes the light to bend around an edge to produce a pattern of alternating light and dark areas. The extent of the alternating areas is on the order of the wavelength of the exposing light and the diffraction pattern intensity falls off rapidly in the shadowed zone. When integrated circuits used conductor widths greater than one micron, the effect of diffraction was small and the differences between the pattern on the mask and the pattern produced on the substrate could be ignored. In modern circuits, with conductors widths well under a micron and even under two tenths of a micron, diffraction and other optical phenomena produce effects that are significant in relation to the size of features being produced by photolithography, and such effects can no longer be ignored.

Because the size of the diffraction effects is related to the wavelength of light used, one way to reduce diffraction effects is to use light having a smaller wavelength. The wavelengths used in new photolithography systems have decreased over the years from visible light to ultra violet to deep ultraviolet. Systems using extreme ultra-violet or soft x-rays are currently being developed. It is desirable, however, to improve the resolution of existing photolithography systems because of the high cost of new systems and because it takes many years for a new generation of photolithography systems to become stable production tools. Moreover, the rate at which shorter wavelength systems are being developed is expected to be insufficient to keep up with the expected reduction in circuit feature size. Thus, it will likely be necessary to overcome diffraction effects, regardless of the wavelength used.

Because it can be determined in many instances how the pattern projected onto the substrate will vary from the mask pattern, the mask pattern can be altered to pre-compensate for the distortion. The projected pattern, rather than the mask pattern itself, then portrays the desired circuit. Techniques for pre-compensating the mask are examples of resolution-enhancing corrections or resolution enhancement techniques. The mask is typically altered by moving features of the mask or adding "sub-resolution" assist features, that is, features that are too small to be imaged individually on the substrate, but that scatter or bend light to alter the image of other, larger features on the mask. These "predistortions" cancel the distortions inherent in the lithography process, resulting in a layout that has improved fidelity to the intended design, improved manufacturing yield, and better circuit performance.

Figure 1A:
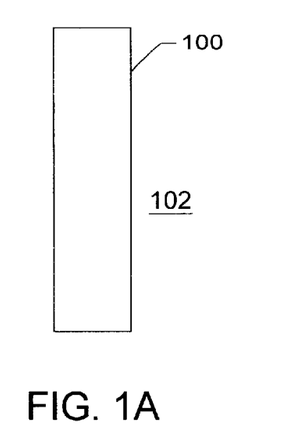
FIG. 1A shows a rectangular pattern on a mask.
Figure 1B:
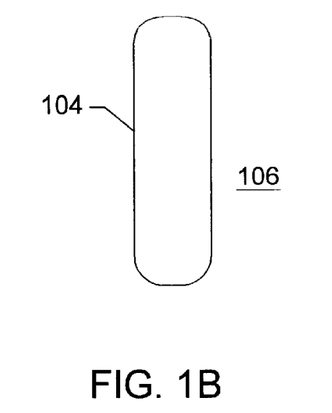
FIG. 1B shows how the mask of FIG. 1A would print on a substrate.
Figure 1C:
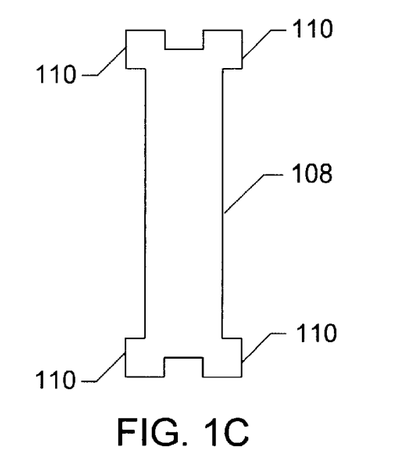
FIG. 1C shows the mask of FIG. 1A modified to add serifs.
Figure 1D:
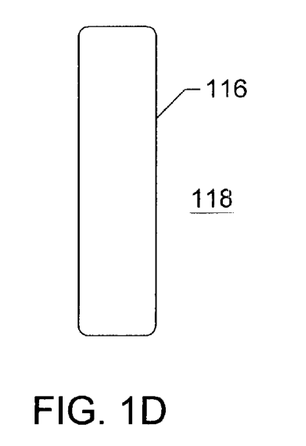
FIG. 1D shows how the mask of FIG. 1C would print on a substrate.

For example, it is known that diffraction effects tend to round off square corners and shorten lines. FIG. 1A shows a pattern 100 on a portion of a mask 102, and FIG. 1B shows the pattern 104 printed by mask 102 onto a substrate 106. Printed pattern 104 is shorter than mask pattern 100 and printed pattern 104 has rounded corners. FIG. 1C shows a modified mask pattern 108 having "serifs" 110 added. FIG. 1D shows the pattern 116 projected onto a substrate 118 by mask pattern 108 using serifs 110. Printed pattern 116 is not as shortened as pattern 104 in FIG. 1B and the corners are not as rounded. The use of serifs was described as early as 1981 by B. E. A. Saleh and S. Sayegh in "Reduction of Error of Microphotographic Reproductions by Optimal Correction of Original Masks," Opt. Eng., vol. 20, p. 781, and is described more recently, for example, in U.S. Pat. No. 5,707,765 to Chen for "Photolithography Mask Using Serifs and Method Thereof."

Figure 2A:
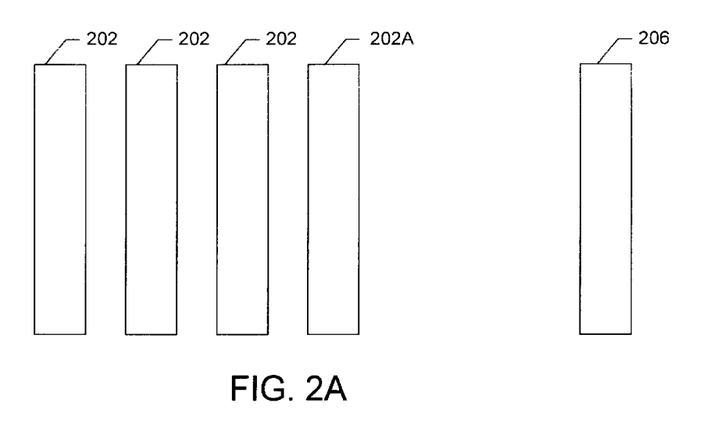
FIG. 2A shows a sample mask pattern having closely spaced lines and an isolated line.

It is also known that the diffraction patterns of closely spaced mask pattern features interact. For example, FIG. 2A shows a group of closely spaced parallel lines 202 and an isolated line 206. Isolated line 206 will print a line having a width different from that of lines printed by closely spaced lines 202. Non-uniform thickness in printed lines can interfere with circuit device functioning as described above. Isolated lines can be made to print like the closely spaced lines by adding "scattering bars" 210 (FIG. 2B), that is, additional lines on the mask on opposite sides of the isolated line. Scattering bars are described, for example, in U.S. Pat. No. 5,821,014 to Chen et al. for "Optical Proximity Correction Method for Intermediate Pitch Features Using Sub-Resolution Scattering Bars on a Mask." Note that a scattering bar 210 is also used along the outside edge of the line 202A, the last line in the closely spaced group. Whether or not a scattering bar is necessary along a particular edge of a feature depends upon the distance to the closest facing feature edge.

Figure 2B:
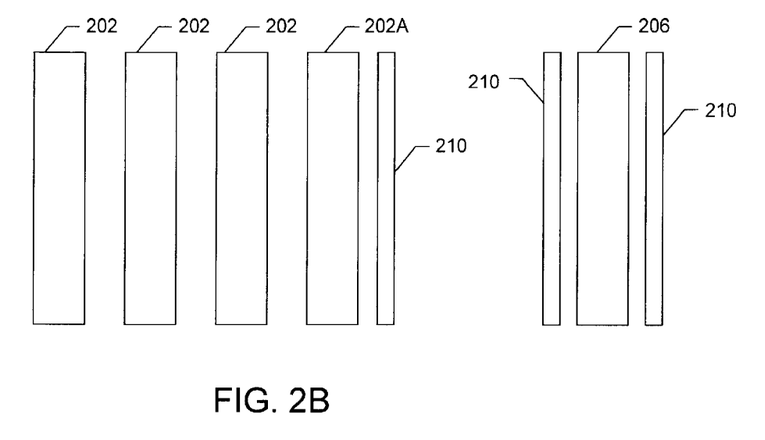
FIG. 2B shows assist features added to the mask pattern of FIG. 2A.

Scattering bars, like the serifs described above, are sufficiently thin that they are below the resolution limit of the lithography system and therefore do not appear or "print" on the photoresist. These features do, however, affect the printed image of the nearby features and can make the printed image of the isolated or outside lines, such as line 202A, consistent with the images of the closely spaced lines. Single or multiple scattering bars can be used on both sides of an isolated line.

Figure 2C:
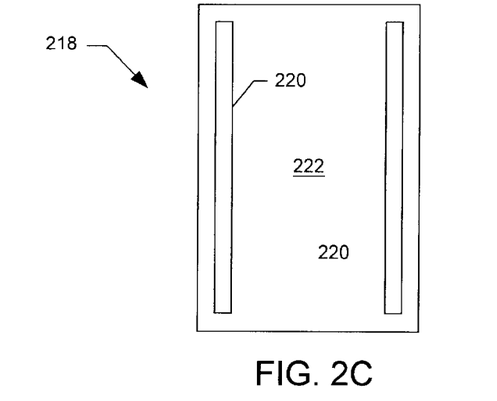
FIG. 2C shows the use of anti-scattering bars, another type of assist feature.

FIG. 2C shows a portion of a mask 218 having another type of assist feature, anti-scattering bars 220. Anti-scattering bars 220 are actually transparent lines created in an otherwise opaque region 222 of the mask. Many types of assist features have been developed. The following is an exemplary, but not exhaustive, list of design structures that can benefit from the addition of assist features: line ends, line corners, isolated lines, isolated lines adjacent to a set of dense lines, cross or "X" structures, and transistor gates.

During the design of masks for fabricating integrated circuits, resolution enhancement techniques are often implemented automatically by automated design tool. The automated design tools review the mask design to locate mask elements that would benefit from a resolution enhancement technique and automatically applies the appropriate technique to the mask. There are two basic strategies used to determine the need to apply a resolution enhancement technique. The first strategy is rule based, and compares the mask features with a set of rules. The second strategy is a model-based.

In a rule-based system, the design is checked against a list of rules, and a resolution enhancement technique is applied when a rule indicates that one is required. Rule-based systems are simpler and use considerably less computing resources than do model-based systems. Because of the large number of possible combination of mask feature patterns and the relatively small number of rules, the rules do not correct the mask equally well in all situations, and techniques may be added where they are not necessary, thereby unnecessarily increasing the mask complexity.

In a model-based strategy, the image that would be produced by a mask pattern is determined using a software model of the mask, and resolution enhancement techniques are applied only where the model shows them to be needed. Model based strategies are more effective, but require more computational resources.

On a typical integrated circuit, groups of features are repeated multiple times throughout the design. Designers simplify the design process by treating groups of features as standard cells and reusing them throughout the design. A design can, therefore, be analyzed at different levels, that is, as a hierarchy of building blocks or "flattened" as a collection of individual polygons. When a mask is being fabricated, the design is flattened to a collection of polygons. Resolution enhancement techniques can be applied at any level of the design hierarchy. It is typically more efficient to apply the techniques at a higher, hierarchical level, so that they need be applied only once for each type of cell. When resolution enhancement techniques are applied to standard cell, however, it may still be necessary to consider how features at the edges of the cells interact with nearby features outside the cell.

When automatic design tools detect the need for resolution enhancement techniques and apply them to a mask, there are sometimes conflicts between the additions or alterations required by features of the mask. A conflict exists when the combination of mask additions or alterations leads to undesirable results on the photoresist or on the mask itself. For example, if overlapping scattering bars were added, they could cause unwanted features to be printed on the substrate. Alternatively, the placement of some assist features could produce a mask having features that are difficult to manufacture or inspect.

Figure 3A:
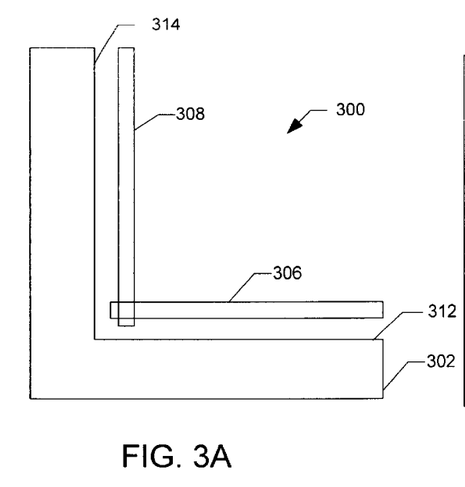
FIG. 3A shows a mask having overlapping assist features.

FIG. 3A shows a portion of mask 300 having a feature 302 that can benefit from the addition of an assist feature, and shows scattering bars 306 and 308 as determined by a design program. The intersection of scattering bars 306 and 308 could cause an artifact to print on the substrate and the small length of scattering bars 306 and 308 that extend past the other scattering bar may be interpreted to be a defect by automated mask inspection software. Scattering bar 306 and 308 are said to interact, and because the interaction is unintended and harmful, they are said to interfere.

Figure 3B:
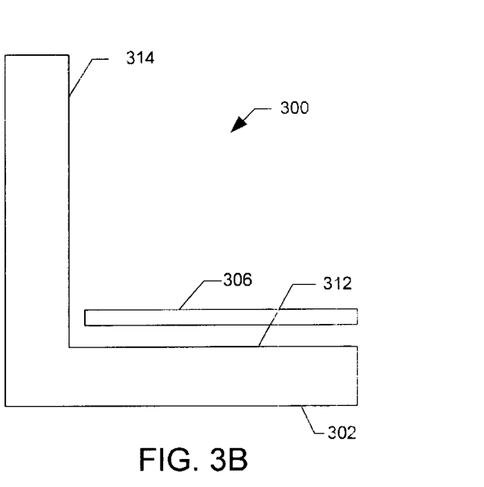
FIG. 3B shows the mask of FIG. 3A with one of the overlapping assist features removed.
Figure 3C:
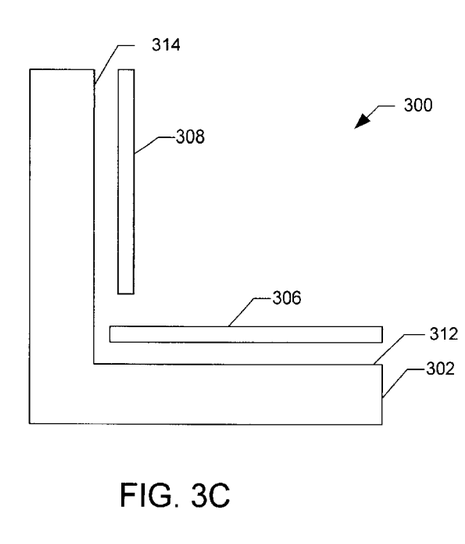
FIG. 3C shows the mask of FIG. 3A with one of the overlapping assist features shortened to eliminate the overlap.
Figure 3D:
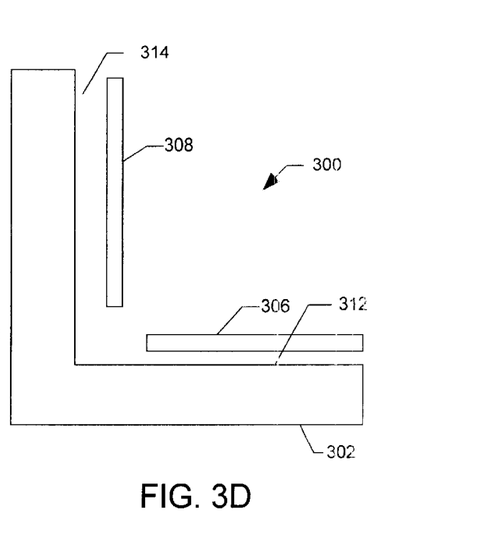
FIG. 3D shows the mask of FIG. 3A with both of the overlapping assist features shortened to eliminate the interfernce.

FIG. 3B shows one way a program could handle the conflict. The program first analyzes edge 312, determines that a scattering bar is necessary, and adds scattering bar 306. Next the program continues with its analysis and determines that a scattering bar is necessary along edge 314. Because a scattering bar along edge 314 would intersect with scattering bar 306, however, the program does not add a scattering bar along edge 314. Thus, the conflict between scattering bars is resolved not on the basis of which assist feature is more important for producing an accurate printed image, but upon which edge the design program happened to analyze first. FIG. 3C shows another method of handling conflicts, in which the second scatter bar 308, rather than being removed entirely, is shortened to remove the overlap. FIG. 3D shows yet another method of handling conflicting scattering bars of FIG. 3A, in which both scattering bars 306 and 308 are truncated to remove the interference. As in the technique described with respect to FIG. 3B, the second scatter bar analyzed is altered, regardless of its relative importance. This technique also can result in the reduction of a critical assist feature to perpetuate a less critical one.

SUMMARY OF THE INVENTION

An object of the invention is to improve lithography tools to improve the fidelity of the lithography process.

The present invention comprises a method and apparatus for implementing resolution-enhancing corrections in lithography tools. In accordance with the invention, resolution-enhancing corrections are assigned priorities. Conflicting resolution-enhancing corrections are identified, and the conflicting resolution-enhancing correction having the lower priority is altered to eliminate the conflict. Prioritizing conflicting resolution-enhancing corrections produces a lithography tool having improved fidelity because resolution-enhancing corrections that provide the most beneficial effects can be implemented at the expense of resolution-enhancing corrections that provide less benefit. In a preferred embodiment, the prioritization is based on the geometry of the conflicting resolution-enhancing corrections or of the pattern features that generate the corrections, rather than on the function of the circuit element corresponding to the mask feature.

The invention includes not only methods for designing a mask, but also software for implementing the methods, a computer programmed to carry out the methods, a computer implementable description of a mask design determined by application of the methods, the fabrication of a mask designed by the methods, and the mask designed by the methods.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 4:
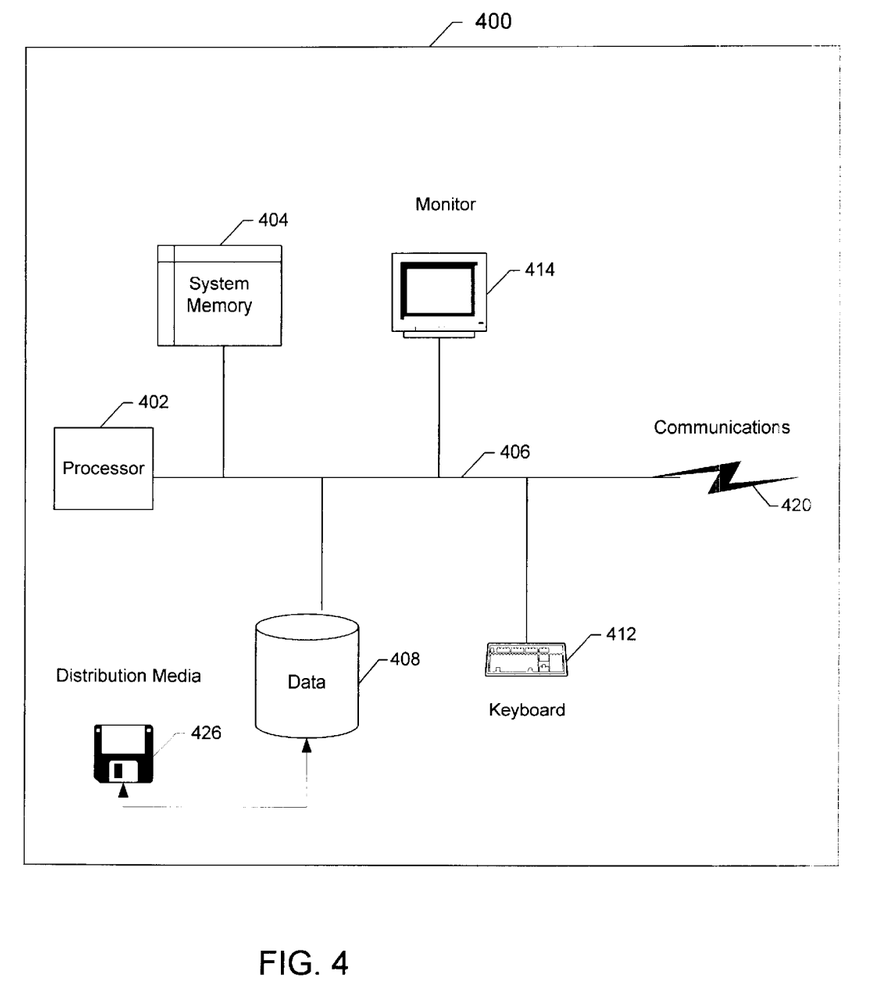
FIG. 4 shows schematically computer hardware that can be used to implement the present invention.

FIG. 4 illustrates a typical computer system 400 that is suitable for use in practicing the invention. Computer system 400 includes a processor 402 and a system memory 404 coupled to each other via system bus 406. Also coupled to system bus 406 are non-volatile mass storage 408, which can include hard disks, floppy disk, optical storage, and so forth; input/output devices, such as a keyboard 412, a display 414, and so forth; and communication interfaces 420, such as a modem, LAN interfaces, and so forth. Each of these elements performs its conventional functions known in the art.

System memory 404 and non-volatile mass storage 408 store a working copy and a permanent copy of the programming instructions for implementing the present invention. Non-volatile mass storage 408 and system memory 404 also store designs for integrated circuits. Non-volatile mass storage 408 may include storage that is physically separated from computer 400 and is accessed through one or more of communication interfaces 420. The permanent copy of the programming instructions may be loaded into non-volatile mass storage 408 in the factory, or in the field, using distribution source/medium 426 and optionally, through communication interfaces 420.

Examples of distribution medium 426 include recordable medium such as tapes, CDROM, DVD, network connections, and so forth. In one embodiment, the programming instructions are part of a collection of programming instructions implementing an Electronic Design Automation (EDA) tool. The elements of computer system 400 are well known, and accordingly will not be further described. Thus, computer readable media upon which instructions for carrying the inventive method can be stored include any combination of distributive media 426, system memory 404, non-volatile mass storage 408, and other media that is part of computer system 400, inserted into computer system 400, or connected to computer system 400 through a network.

Figure 5:
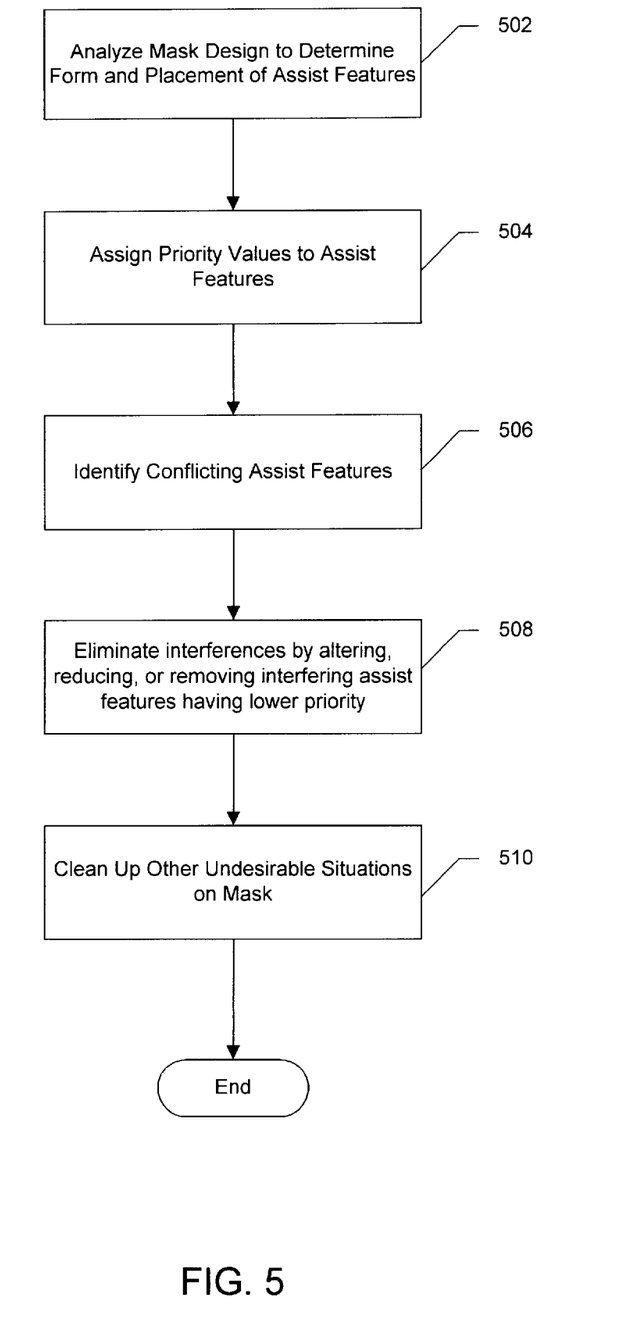
FIG. 5 a flow chart showing the steps of a preferred embodiment of the present invention.

FIG. 5 shows the steps of a preferred embodiment of the present invention. In step 502, a mask design is analyzed to determine where assist features or other resolution enhancement techniques can be employed, and the preferred form of those techniques. Although the description below refers to assist features and scattering bars, the invention is useful with any resolution enhancement technique that entails mask alteration that may conflict. The invention is not dependent on the method used to analyze the mask and generate the assist features. The assist features can be determined and inserted into the design at any level of the design process, although it is typical to determine assist features as part of the verification process or as part of the data preparation procedure for mask writing. If the assist features are added after the design is flattened, that is, reduced to a single level, the determination of assist features is less complex, but many more computations are required. If the assist features are added when the design is still at a level of repeating cells, the assist features can be determined once for the interior of the cell, and those assist features will be the same for all cell interiors. It is still necessary to examine the interactions between edges at the cell boundary, however, to determine whether assist features are necessary near cell boundaries.

In step 504, assist features are assigned priority values. The priority values can be assigned based solely on the geometry of the mask, without regard to function of the circuit features represented by the mask elements. For example, if a mask element edge generates multiple assist features, those features closer to the mask element may be assigned a higher priority than features further from the element. Features generated from an edge parallel to an axis of the mask may be assigned a higher priority than assist features generated by an edge that is not parallel to an axis. In some embodiments, priority can be based upon the function of a feature in a circuit, for example, a feature on the mask that corresponds to a transistor gate may be assigned a higher priority than a feature that corresponds to an interconnect between transistors.

In step 506, interfering assist features are identified. Assist features are considered to interfere when the combination of assist features, or the combination of assist features with altered mask features interact to adversely affect the fidelity of the printing. For example, when features touch or are closer than a minimum spacing, they can cause an artifact to be printed on the photoresist. Assist features can also interfere by producing a combination that will interfere with mask production or inspection, such as small extensions past a line that will appear as an error to a mask inspection system. Interactions can be determined, for example, by rules or through simulation to determine whether interaction between assist or between an assist and In step 508, the interfering assist feature having the lowest priority is altered to eliminate the interference. The alteration may entail changing, reducing, or removing the assist feature. In step 510, the mask design is reviewed a final time to clean up any aspects of the modified design that will cause a problem in manufacturing the mask, inspecting the mask, or printing. The process is then complete. Skilled persons will recognize that many of the steps in FIG. 5 can be combined or performed in a different order. For example, priority values can be assigned after interfering assist features are identified, and only interfering assist features need to be assigned priority values.

Figure 6:
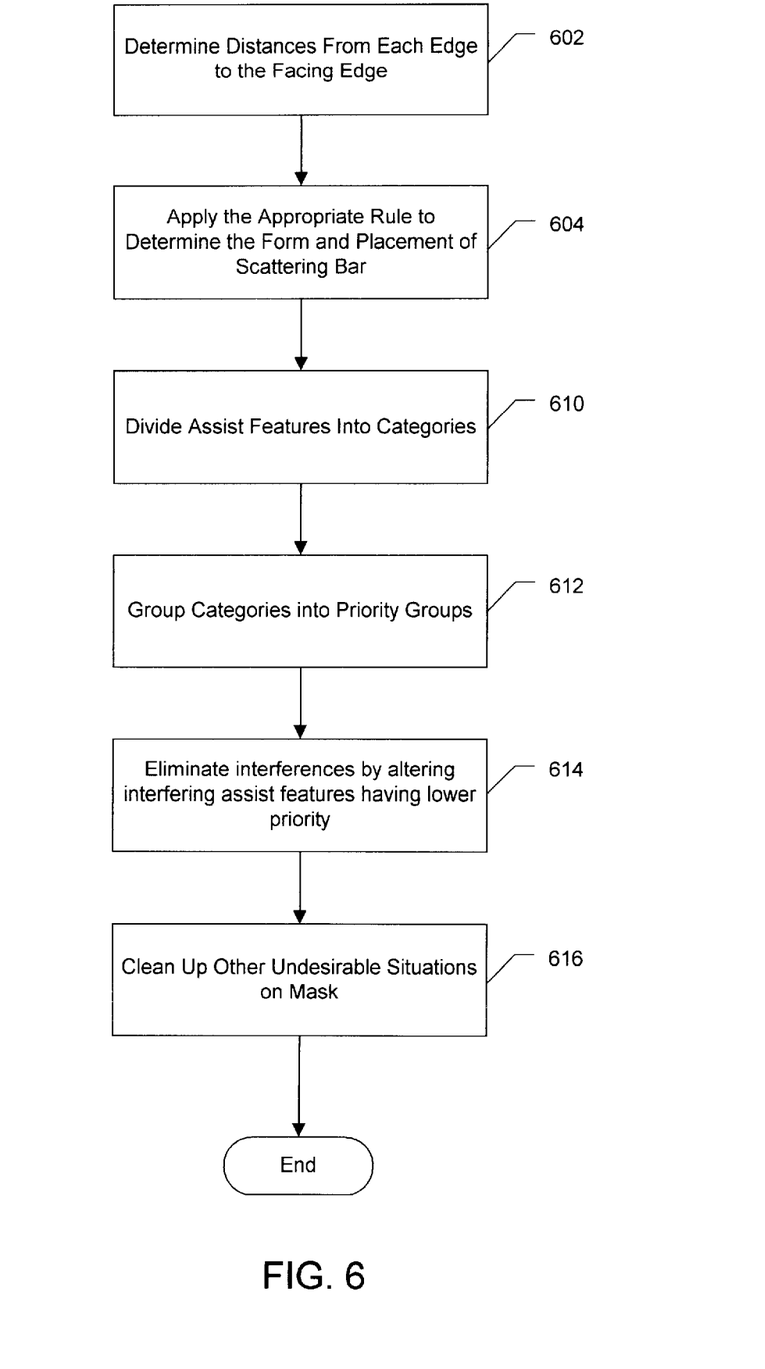
FIG. 6 is a flow chart shows showing in more detail steps of a preferred embodiment of the present invention.

FIG. 6 shows in more detail a preferred process for implementing scattering bars. In this embodiment, the mask is first analyzed in terms of its edges. Edges are defined by two or more points in the pattern, and multiple edges combine to provide a structure or feature.

In step 602, the distance between each edge and its closest facing edge across a clear area of the mask is determined. In step 604, the position and form of a scattering bar or bars are determined based upon a set of rules that depend upon the distance determined in step 602. The rules may specify, for example, the quantity, position relative to the edge, and thickness of the scattering bars and may include various rules about how to handle overlapping. For example, if two edges are separated by a relatively large distance, the rules may specify that two scattering bars are placed parallel to each of the edges. If two edges are relatively close, but not so close as to render a scattering bars unnecessary, the rules may specify that a single, thicker scattering bar is placed between the two edges.

The rules that determine placement and form of scattering bars are specified by a designer and the rules will change depending on the lithography process used and the mask making restraints. Designers will typically determine the best set of rules for a particular process using test masks and measuring the effect of different rules on the printing process. The size and positioning of assist features can be determined using a rules-based approach, a model-based approach, or other technique.

In step 610, the scattering bars are grouped into categories based upon a number of factors. Some of the categories may depend upon the orientation of the edge that generates the scattering bar and upon the orientation of its nearest facing edge. Edges that are parallel to the axis of the mask are referred to as "orthogonal," and edges that are not parallel to an axis are referred to as "angled." Because some edges generate multiple scattering bars, categories can also be based upon whether a particular scattering bar is the closest or furthest scattering bar from the edge. The following categories are used in one embodiment:

a) scattering bars that are closest to their generating edges and in which the generating edges are orthogonal and the facing edges are orthogonal;

b) scattering bars that are furthest from their generating edge and in which the generating edges are orthogonal and the facing edges are orthogonal;

c) scattering bars that are closest to their generating edges and in which the generating edges are orthogonal and the facing edge is angled;

d) scattering bars that are furthest to their generating edges and in which the generating edges are orthogonal and the facing edge is angled;

e) scattering bars that are closest to their generating edges and in which the generating edges are angled and which facing any edge; and f) scattering bars that are furthest to their generating edges and in which the generating edges are angled and which facing any edge.

In step 612, the classification a) through f) above are further collected into three priority groups:

Priority 1 Group, including classes a) and c);

Priority 2 Group, including classes b) and d); and

Priority 3 Group, including classes e) and f).

In step 614, the mask pattern is modified using the prioritization information to remove interfering assist features. The modification may entail, for example, removing lower priority features, shortening features, or splitting features. For example, when a feature in priority group three interferes with a feature in priority group one or two, the feature in priority group three is reduced or removed to eliminate the interference. When a feature in priority group two interferes with a feature in priority group one, the feature in priority group two is reduced or removed to eliminate the interference. When features in the same priority group interact, both features can be cut back or reduced and, in certain situations, they can be combined to result in a single assist feature. For example, if two scattering bars meet such that the ends of the scattering bars overlap to form a "+" structure, the ends of both scattering bars can be shortened to provide a "L" structure, thereby merging the two assist features having the same priority into a single assist feature. Other resolutions can also be provided for same priority conflicts.

Figures 7A, 7B:
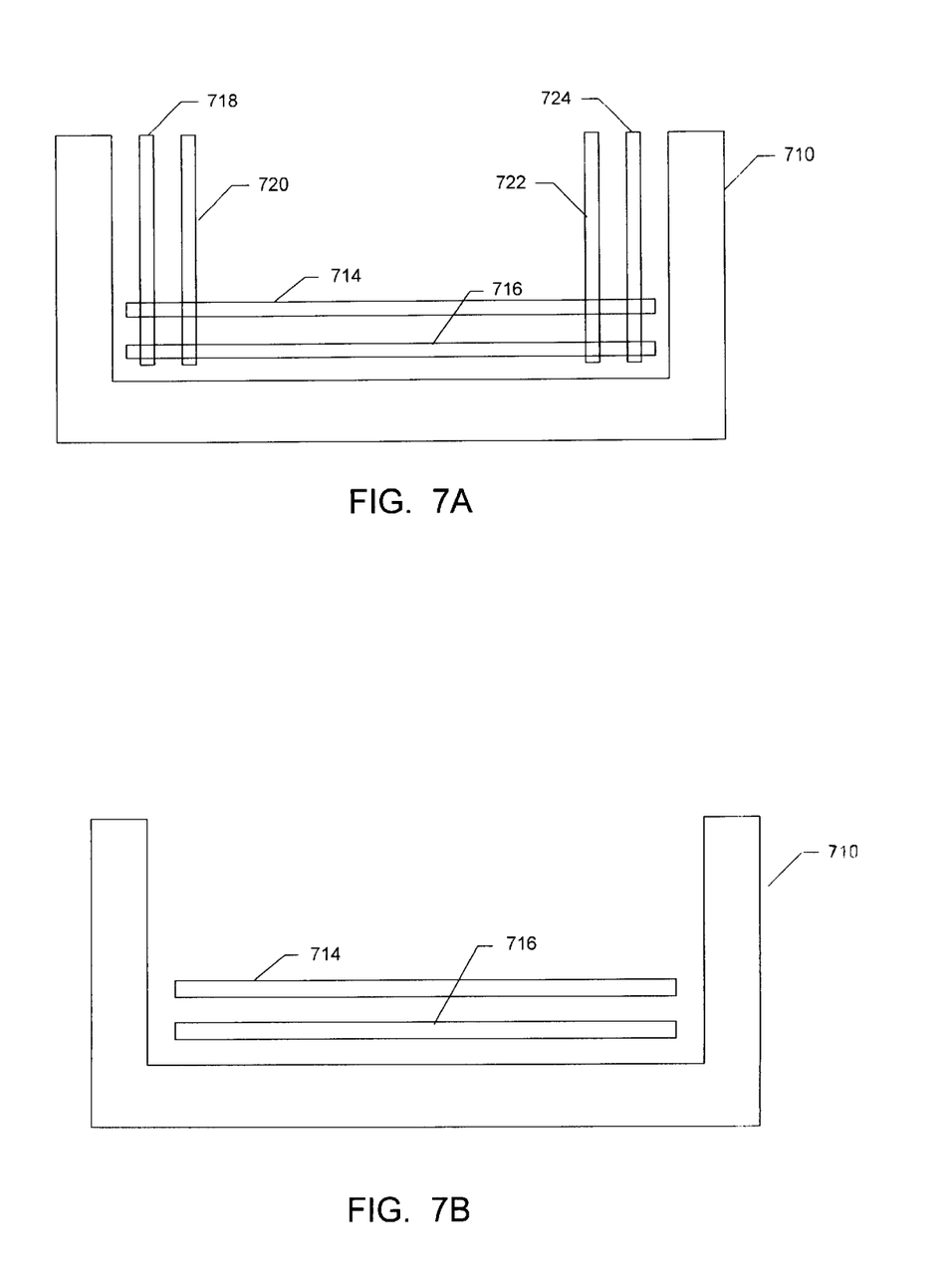
FIG. 7A shows a mask pattern having interfering scattering bars.
FIG. 7B shows a prior art solution to the interfering scattering bars of FIG. 7A.

In step 616, the mask pattern is reviewed to remove any other features specified by the designer as undesirable, such as features that violate rules with regard to spacing or widths of mask features FIG. 7A shows an example of a mask pattern 710 which has been analyzed and scattering bars added. The overlap of horizontal scattering bars 714 and 716 with vertical scattering bars 718, 720, 722, and 724 could cause an artifact to be printed at the intersections and result in a loss of fidelity in printing the circuit pattern. FIG. 7B shows a prior art approach to interfering scattering bar, in which the first scatter bars created, scattering bars 714 and 716, are maintained and in which interfering scattering bars are simply not implemented.

Figure 7C:
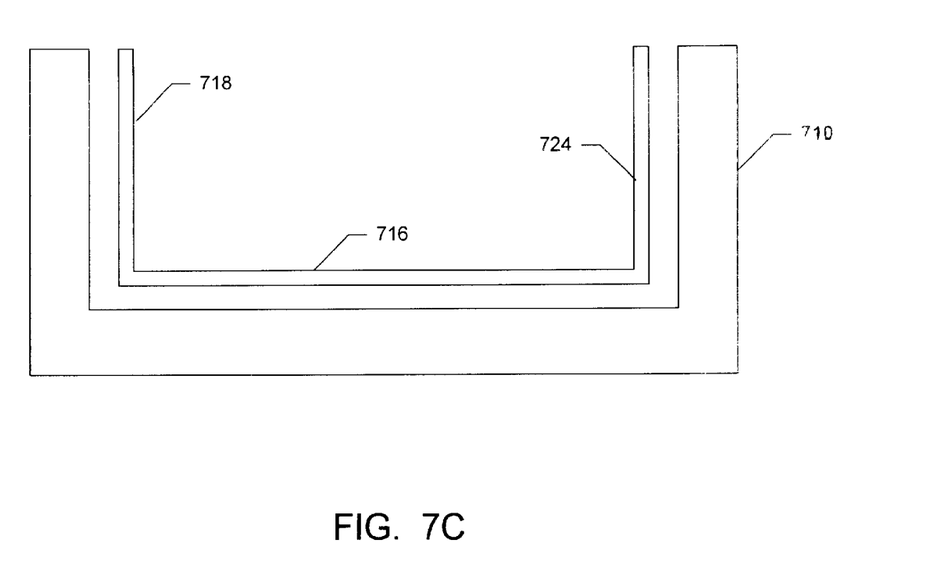
FIG. 7C shows a solution in accordance with the present invention for the interfering scattering bars of FIG. 7A.
Figure 7D:
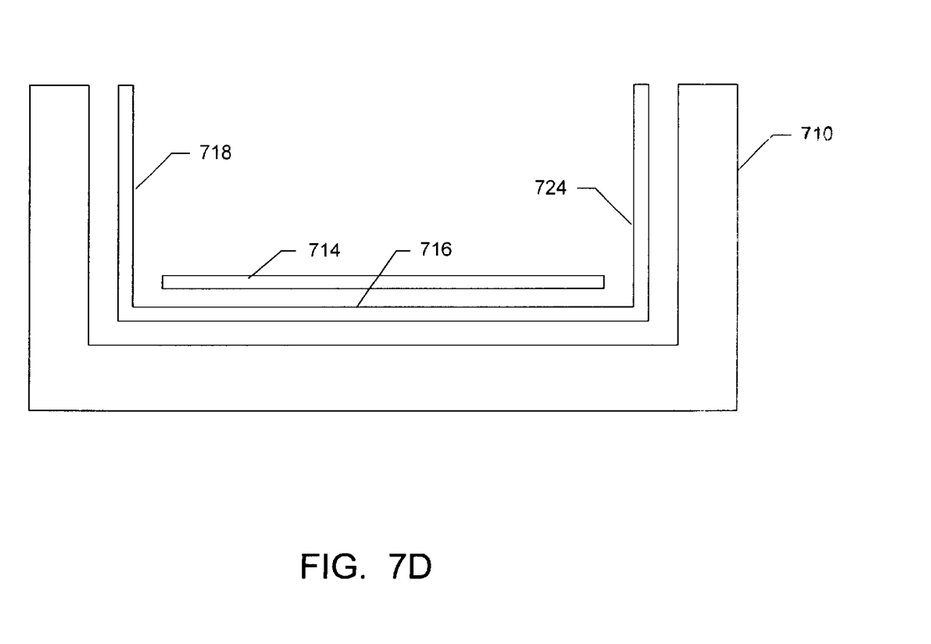
FIG. 7D shows another solution in accordance with the present invention for the interfering scattering bars of FIG. 7A.

In accordance with a typical embodiment of the invention, scattering bars 716, 718, and 724 would typically be assigned a higher priority than scattering bars 714, 720, and 722 because scattering bars 716, 718, and 724 are closer to the generating edges of mask feature 710. Scattering bars 716, 718, and 724 would be fit into category "a)" in step 610 and would therefore be in priority group 1. Scattering bars 714, 720, and 722 would be fit into category "b)" in step 610 and would therefore be in priority group 2. FIG. 7C shows that scattering bars 714, 720, and 722 are removed, and the intersections of the remaining scattering bars 716, 718, and 724 are made into "L"-shaped intersections by removing the portions of each scattering bar that extends toward mask feature 710 past the intersecting bar. Other ways of modifying the bars are possible. For example, FIG. 7D shows 716, 718, and 724 are made into "L"-shaped intersections as in FIG. 7C, but in FIG. 7D, the lower priority scattering bar 714 is retained, but is shortened to eliminate its interference with higher priority scattering bars while scattering bars 720 and 722 are removed. Scattering bar 714 may be retained because horizontal bars may have been assigned higher values than vertical bars, such as 720 and 722. Alternatively, the rule specifying that scattering bar 714 be retained may provide a preference to the longer of interfering scattering bars.

Figure 8A:
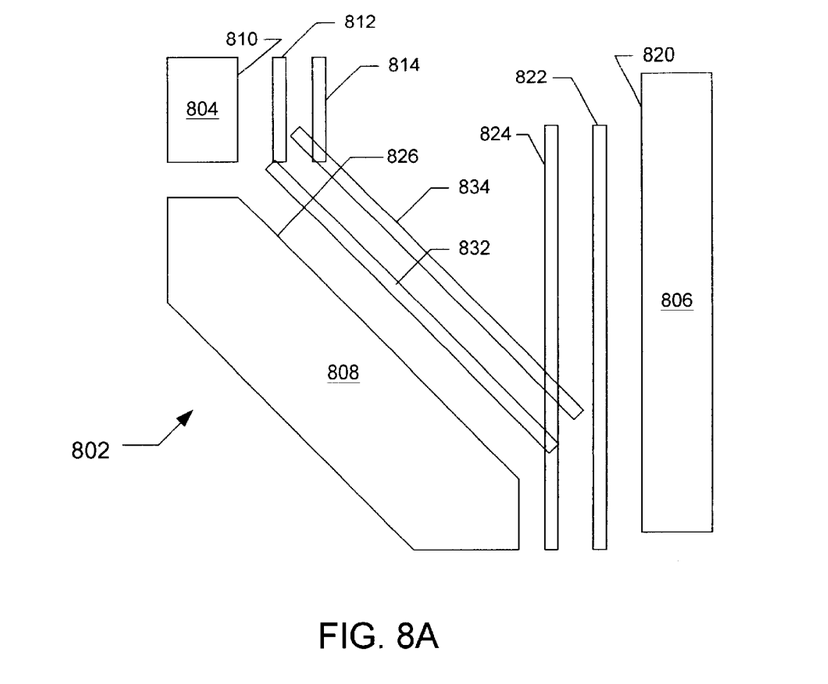
FIG. 8A shows another mask pattern having interfering scattering bars.
Figure 8B:
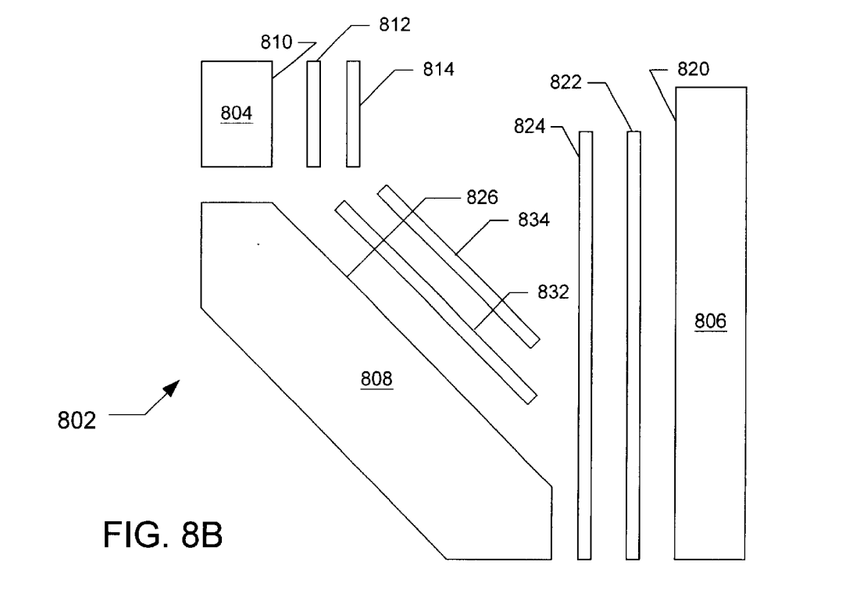
FIG. 8B shows a solution in accordance with the present invention for the interfering scattering bars of FIG. 8A.

FIGS. 8A and 8B show another example of prioritization of assist features. FIG. 8A shows that mask 802 includes rectangles 804 and 806 having only orthogonal edges and a feature 808 having two angled edges. FIG. 8A shows that edge 810 of rectangle 804 generated an adjacent scattering bar 812 and a second scattering bar 814. Similarly, edge 820 of rectangle 806 generates an adjacent scattering bar 822 and a second scattering bar 824. An angled edge 826 of feature 808 also generates an adjacent scattering bar 832 and a second scattering bar 834. In accordance with the prioritization scheme described above with respect to FIG. 6, scattering bar 812 is in category "a)"; scattering bar 814 is in category "b)"; scattering bar 822 is in category "c)" scattering bar 824 is in category "d)"; scattering bar 832 is in category "e)"; and scattering bar 834 is in category "e)". Scattering bars 822 and 812 are in priority group 1. Scattering bars 814 and 824 are in priority group 2. Scatterings bars 832 and 834 are in priority group 3.

FIG. 8B shows how the pattern of mask 802 may be altered to eliminate interacting features in accordance with assist feature prioritization. Scattering bars 832 and 834, which interact with scattering bars 812 and 814, are shortened to eliminate the interaction. Scattering bars 812 and 814 are not changed to correct the interaction because they have higher priorities than scattering bars 832 and 834, which are generated by an angled edge.

The ends of the modified scattering bars are typically maintained at right angles with respect to the longer edges of the scattering bars to reduce optical effects from odd shaped ends. A minimum area of assist features is typically specified to prevent the assist feature from being perceived as a defect by the mask inspection system. If, as the result of conflict resolution, an assist feature is reduced to less than a minimum area, that assist feature is completely removed from the mask/reticle layout.

The invention can be applied at any level of the design hierarchy, from a high level to a flattened level. Moreover, the invention can be applied while resolution enhancement corrections are being determined for a mask design or can be used to prioritize previously determined resolution enhancement corrections.

The methods and apparatuses are described herein with respect to photolithography for integrated circuit manufacturing; however, the techniques described can be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques. Moreover, the invention is not limited to lithography using any particular wavelength of exposing radiation.

Although the inventions show conflict resolution rules that entail altering the assist feature, the invention could be used to prioritize any resolution enhancement features, such as alternations of the mask pattern itself, for example, by jogging or fragmenting an edge.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method of employing scattering bars to enhance the resolution of a lithography mask, comprising:
   automatically determining in a pattern on a lithography mask design edges that would benefit from the addition of scattering bars;
   automatically determining the placement of scattering bars for those edges;
   automatically determining whether two or more scattering bars interfere;
   automatically determining a priority value for each of the interfering scattering bars, the priority values being determined solely by the position or orientation of the scattering bars; and
   automatically altering an interfering scattering bar having a lower priority to eliminate its interference with a scattering bar having a higher priority.

2. The method of claim 1 in which:
   automatically determining the placement of scattering bars includes determining the placement of multiple scattering bars for a single edge; and automatically determining a priority value for each of the interfering scattering bars includes assigning a higher priority value to scattering bars immediately adjacent to their generating edge than to scattering bars not immediately adjacent to their generating edge.

3. The method of claim 1 in which automatically determining a priority value for each of the interfering scattering bars includes assigning a higher priority value to scattering bars that are generated from edges parallel to one of the lithography mask coordinate system axes than to scattering bars generated from edges that intersect the axes at a non-normal angle.

4. A computer readable medium including instruction for carrying out the method of claim 1.

5. A method for designing a lithography mask, comprising:

providing multiple assist features for the mask design;

automatically determining whether any of the determined multiple assist features interfere with another or others of the multiple assist features;

automatically assigning priority values to each of the interfering assist features, the priority based solely upon mask or assist feature geometry; and automatically altering the interfering assist features having the lowest priority value to remove the interference.

6. The method of claim 5 in which automatically assigning priority values to each of the interfering assist features includes assigning a priority based upon the geometry of the interfering assist features.

7. The method of claim 5 in which automatically assigning priority values to each of the interfering assist features includes assigning a priority based upon the position or orientation of the interfering assist features.

8. The method of claim 5 in which automatically assigning priority values to each of the interfering assist features includes assigning a priority based upon the proximity of the interfering assist feature to the feature being assisted.

9. The method of claim 5 in which automatically assigning priority values to each of the assist features includes assigning a priority based upon the orientation of the feature being assisted.

10. A computer readable medium including computer instructions for carrying out the steps of claim 5.

11. A method for designing a lithography mask having enhanced resolution, comprising:

providing for multiple features of a lithography mask design resolution-enhancing corrections;

automatically determining whether two or more of the determined resolution-enhancing corrections will interact with each other to adversely affect printing; and altering the one of the interacting resolution-enhancing corrections that provides the least benefit to printing.

12. The method of claim 11 in which altering the one of the interacting resolution-enhancing corrections includes:

classifying the resolution-enhancing corrections into categories, each category having a priority value; and altering the one of the interacting resolution-enhancing corrections that is classified within the category having a priority value lower than that of the categories in which the other interacting resolution-enhancing correction are classified.

13. The method of claim 12 in which the resolution-enhancing corrections include the addition of assist features and in which the category, and therefore the priority, of the assist features are determined by the geometry of the assist features.

14. The method of claim 13 in which the category, and therefore the priority, of each the assist features is determined by the position or orientation of the assist feature.

15. The method of claim 14 in which the categories, and therefore the priority, into which each of the assist features is classified is determined at least in part by the proximity of that assist feature to the lithography mask feature to which the assist features are applied.

16. The method of claim 14 in which the category of an assist feature is determined at least in part by the orientation of the lithography mask feature to which the assist feature is applied.

17. The method of claim 11 in which providing for multiple features of a lithography mask resolution-enhancing corrections includes automatically determining resolution-enhancing corrections using hierarchical design information.

18. The method of claim 11 in which providing for multiple features of a lithography mask resolution-enhancing corrections includes automatically determining resolution-enhancing corrections using flattened design information.

19. A method of fabricating a lithography mask comprising forming a pattern on a substrate in accordance with a mask design determined by the steps of claim 11.

20. A lithography mask designed in accordance with the process of claim 19.

21. A computer readable medium comprising instructions for executing the method of claim 11.

22. A computer readable medium comprising computer implementable description for fabricating a mask designed in accordance with claim 11.

23. A computer readable medium comprising instructions for executing the method of claim 12.

24. A computer programmed to perform the steps of claim 11.

25. A method for designing a lithography mask used in the process of fabricating a circuit, comprising:

providing multiple assist features for the mask design;

automatically determining whether any of the determined multiple assist features interfere with another or others of the multiple assist features;

automatically assigning priority values to each of the interfering assist features, the assigned priority being based upon information associated with the mask being designed and not being based upon other information about the circuit being fabricated; and automatically altering the interfering assist features having the lowest priority value to remove the interference.

* * * * *